United States Patent

Mori et al.

[11] Patent Number: 5,980,296
[45] Date of Patent: *Nov. 9, 1999

[54] CONNECTING STRUCTURE FOR FLAT CIRCUIT BODY AND CONNECTOR

[75] Inventors: Toshiyuki Mori; Keiichi Ozaki, both of Shizuoka-ken, Japan

[73] Assignee: Yazaki Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/877,622

[22] Filed: Jun. 18, 1997

[30] Foreign Application Priority Data

Jun. 24, 1996 [JP] Japan ................................ 8-163233

[51] Int. Cl.⁶ .................................................. H01R 13/74
[52] U.S. Cl. ........................................ 439/329; 439/557
[58] Field of Search ............................... 439/67, 59, 77, 439/329, 493, 629, 630, 631, 353

[56] References Cited

U.S. PATENT DOCUMENTS

| | | | |
|---|---|---|---|
| 3,719,917 | 3/1973 | Fischer et al. | 439/329 |
| 4,025,142 | 5/1977 | Huber et al. | 439/353 |
| 4,054,348 | 10/1977 | Stroupe et al. | 439/329 |
| 4,072,387 | 2/1978 | Sochor | 439/329 |
| 5,035,641 | 7/1991 | Van-Santbrink et al. | 439/329 |
| 5,199,896 | 4/1993 | Mosquera | 439/329 |
| 5,707,241 | 1/1998 | Hamlin et al. | 439/329 |

FOREIGN PATENT DOCUMENTS

| | | |
|---|---|---|
| 57-29082 | 2/1982 | Japan . |
| 63-119148 | 8/1988 | Japan . |
| 63-130353 | 8/1988 | Japan . |
| 63-195945 | 12/1988 | Japan . |
| 2-45845 | 3/1990 | Japan . |
| 6-26179 | 4/1994 | Japan . |

*Primary Examiner*—Hien Vu
*Attorney, Agent, or Firm*—Finnegan, Henderson, Farabow, Garrett & Dunner, L.L.P.

[57] ABSTRACT

A connecting structure for connecting circuit conductors placed on a surface of an insulator plate of a flat circuit body with terminals of a connector. The terminals of the connector are formed by spring portions exposed above the surface of a housing of the connector. A locking member formed into a shape of square bracket having two arms encompasses the flat circuit body and the connector and hooks at the tips of the two arms engage with engagement grooves on the housing of the connector, while the circuit conductors of the flat circuit body are press-contacted against the spring portions of the housing of the connector.

4 Claims, 5 Drawing Sheets

CONNECTING STRUCTURE FOR FLAT CIRCUIT BODY AND CONNECTOR

BACKGROUND OF THE INVENTION

1. Field of the Invention

The present invention relates a connecting structure for connecting a connector with a flat circuit body, such as a flat cable or a printed substrate, where circuit conductors are placed on a surface of an insulator plate (at least on areas connecting to the connector).

2. Description of the Prior Art

As disclosed in Japanese Provisional Utility Model Publication Laid-open No. 026179 of 1994, for connecting a flat cable or printed circuit with a connector provided on another circuit, an exposed conductor area provided at the end of such a flat cable or printed circuit has conventionally been inserted as a terminal area of the male part into a receptacle of the connector, thereby achieving a connection between the flat circuit body and the connector.

When the male terminal area of the flat circuit body is inserted into the female terminal on the connector to achieve the connection between them, however, frictional sliding movements at the time of insertion or disconnection may scrape off the circuit conductors comprising the terminal area of the flat circuit body or repeated frictional sliding movements may cause corrosion to damage the circuit body. In addition, twining-into during the insertion, insertion in a wrong way and so on could deform the terminal area of the flat circuit body or the terminals of the connector, preventing a reliable connection from being obtained.

SUMMARY OF THE INVENTION

In the light of the above, it is the objective of the present invention to provide a connecting structure for flat circuit and connector in which circuit conductors of a flat circuit body may be electrically connected to terminals of a connector in a reliable manner with no frictional sliding movements.

In order to achieve the above objective, according to an aspect of the present invention, there is provided a connecting structure for flat circuit body and connector, comprising: a flat circuit body whose insulator plate has circuit conductors provided on its surface; a connector whose housing has terminals formed by spring portions exposed above its surface; and a locking member formed into a shape of square bracket having two arms, for encompassing said flat circuit body and said connector by said two arms, the tips of said two arms engaged with said connector, while said circuit conductors of said flat circuit body are press-contacted against said spring portions of said connector.

According to this structure, the arms of the locking member may be engaged with the housing of the connector to thereby press-contact the circuit conductors of the flat circuit body against the terminals of the connector. It will therefore not cause the circuit conductors to frictionally slide in relation to the terminals of the connector. Also, because the circuit conductors are contacted against the spring portions of the terminals of the connector, a proper press-contacted state may always be ensured.

In one preferable embodiment of the present invention, said connector has engagement grooves formed across the upper and lower end faces of its housing in a direction parallel to the surface of the housing, and the tip of each of said two arms is provided with a hook for engaging with said engagement groove when the locking member is slid along said flat circuit body.

According to this structure, with the circuit conductors of the flat circuit body being abutted to the spring portions of the terminals of the connector, the locking member may be slid and the hooks on the tips of the arms may be engaged in the grooves to thereby press-contact the circuit conductors of the flat circuit body against the spring portions of the terminals of the connector.

In another preferable embodiment, the insulator plate of said flat circuit body is formed with two guide holes, and each of said two arms is passed slidably through each of the two guide holes and locked by each of the hooks against slipping out to thereby attach said locking member to said flat circuit body.

According to this structure, the arms of the locking member may be slid along the guide holes formed through the insulator plate of the flat circuit body to thereby easily connect the flat circuit body with the connector. Also, because the locking member is integrally attached to the flat circuit body, it will not be necessary to manage the locking member as an independent component.

In still another preferable embodiment of the present invention, the housing of said connector is formed with engagement recesses on the upper and lower end faces, the tip of each of said two arms is provided with a hook for engaging with the engagement recess, and the insulator plate of said flat circuit body is formed with two throughholes, each of said two arms adapted to be passed through each of said two throughholes and slid in a direction of the passage to engage the hooks of said two arms with said engagement recesses.

According to this structure, the arms of the locking member may be passed through the throughholes formed through the insulator plate of the flat circuit body and slid in a direction of the passage to be forcibly pushed to thereby engage the hooks on the tips of the arms into the engagement recesses of the housing of the connector, so that the circuit conductors of the flat circuit body may be press-contacted against the spring portions of the terminals of the connector.

In yet another preferable embodiment of the present invention, the insulator plate of said flat circuit body comprises a wall body of a protector.

According to this structure, because the insulator plate of the flat circuit body comprises the wall body of the protector, the flat circuit body per se may be solidified and stabilized in shape.

The nature, principle and utility of the invention will become more apparent from the following detailed description when read in conjunction with the accompanying drawings.

BRIEF DESCRIPTION OF THE DRAWINGS

In the accompanying drawings.

DESCRIPTION OF THE PREFERRED EMBODIMENTS

Embodiments of the present invention will now be described with reference to the accompanying drawings.

Figure 2:
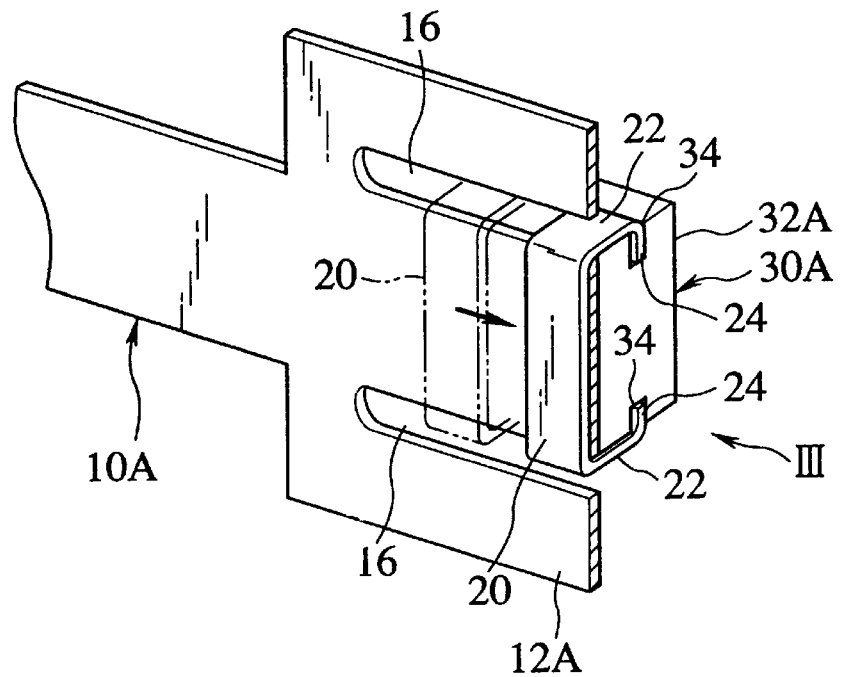
FIG. 2 is a perspective view for describing the operation during connection of the first embodiment of the present invention, with the principal part shown in section.
Figure 3:
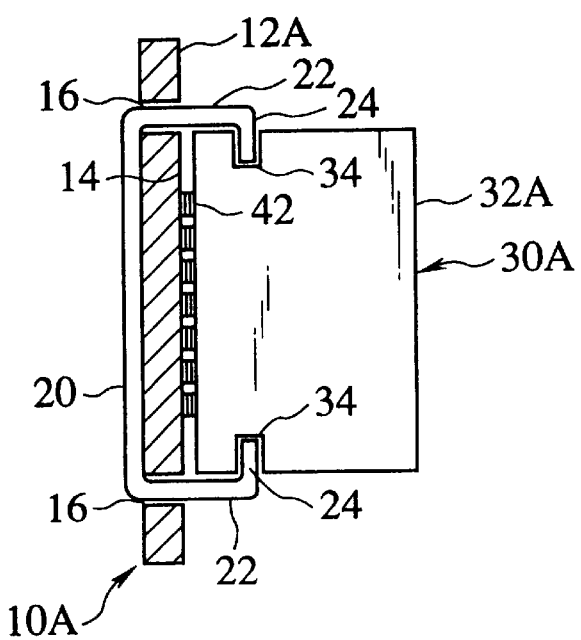
FIG. 3 is a view of the section shown in FIG. 2 as viewed from the front.
Figure 4:
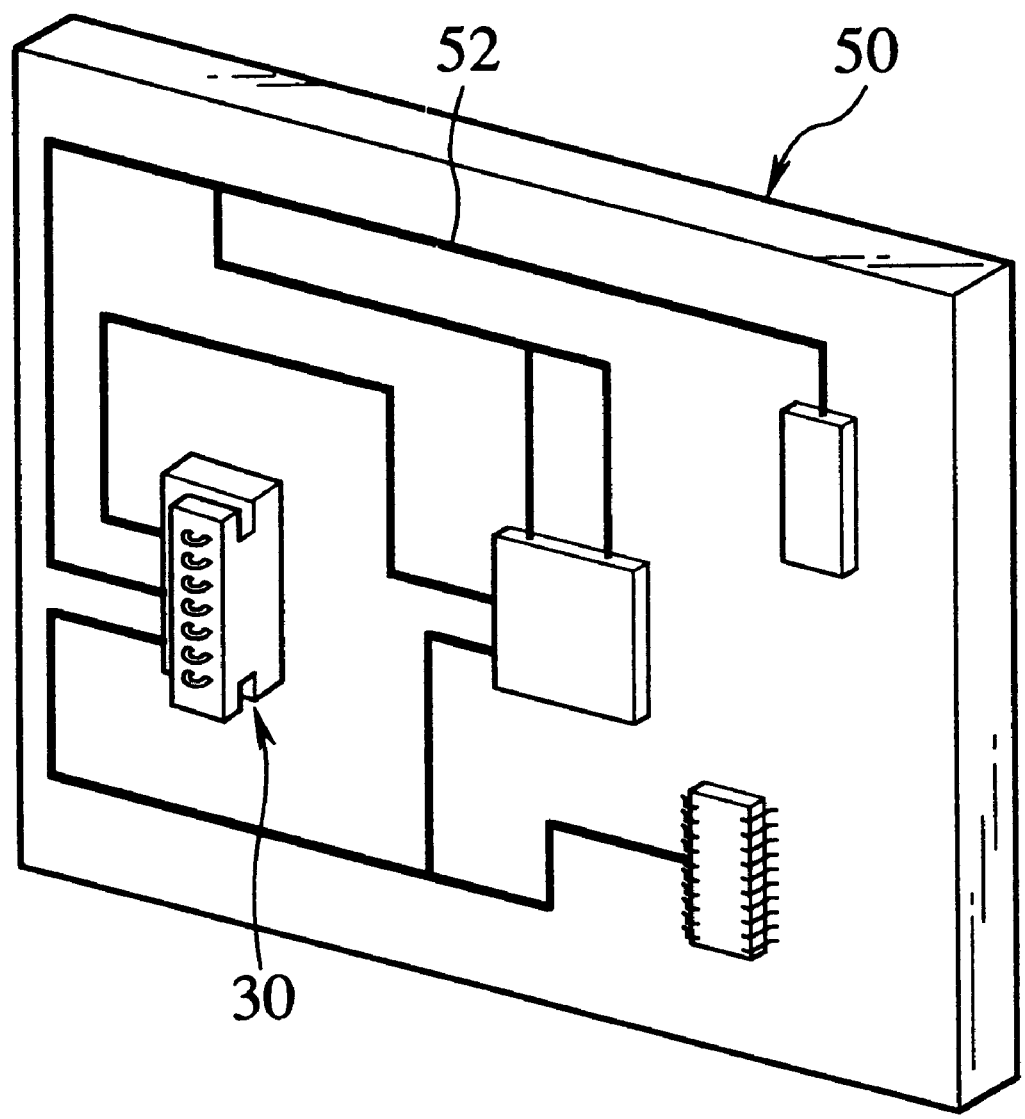
FIG. 4 is a perspective view illustrating a circuit substrate having the connector according to the first embodiment of the present invention attached thereto.

FIGS. 1 to 4 illustrate a first embodiment of the present invention. In FIG. 1A, reference numeral 10A denotes a flat circuit body formed as a protector with wiring on it. The flat circuit body 10A comprises a flat, highly rigid insulator plate 12A making up a wall body of the protector which has a plurality of circuit conductors 14 formed by printing on its surface. The circuit conductors 14 extend in parallel to each other with a predetermined space between them. Numeral 30A denotes a connector to which the flat circuit body 10A will be attached. Numeral 20 denotes a slide lock (locking member) as a member operable for connecting the flat circuit body 10A to the connector 30A. The connector 30A in this embodiment is disposed on another printed substrate 50 as shown in FIG. 4, and is electrically connected with circuit conductors 52 on the printed substrate 50.

Figure 1A:
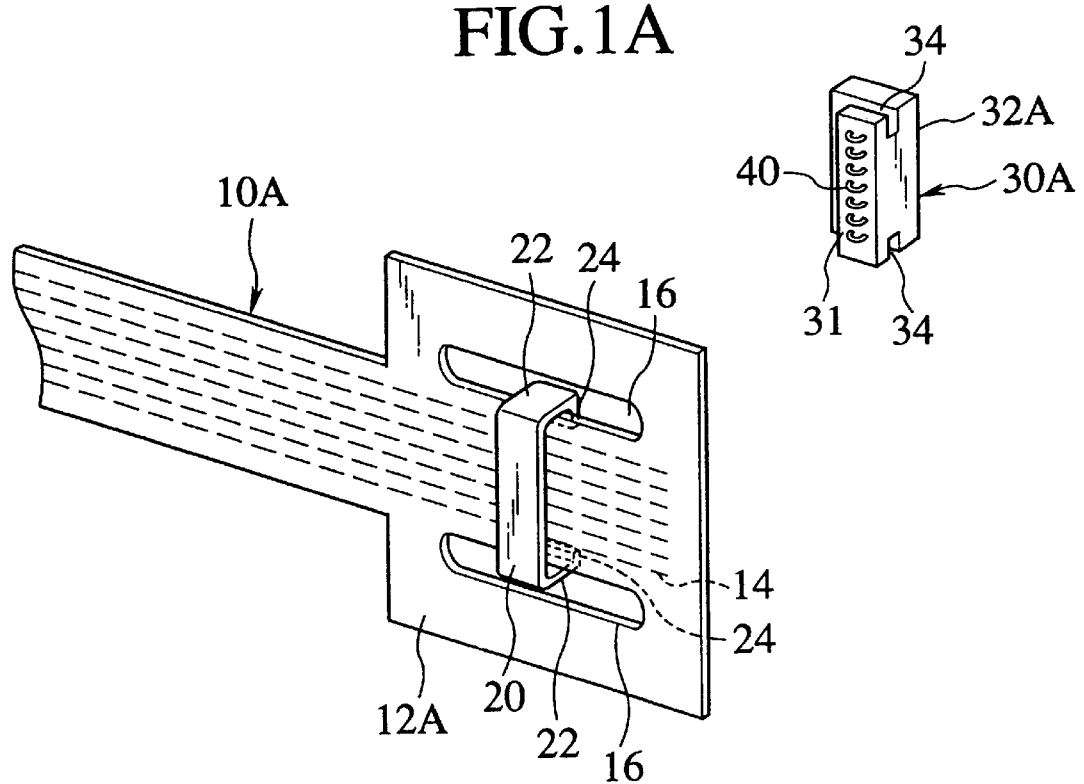
FIG. 1A is a perspective view illustrating a connecting structure of a first embodiment of the present invention in an unassembled state.
Figure 1B:
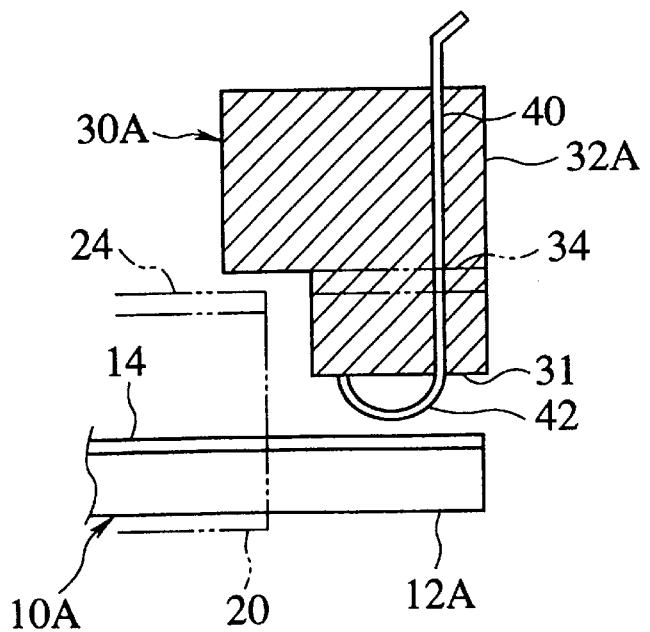
FIG. 1B is a sectional view of the principal part illustrating the relationship between a circuit conductor of the flat circuit body and a terminal of a connector.

As illustrated in FIGS. 1A and 1B, a housing 32A of the connector 30A is provided with an abutment surface 31 for facing the flat circuit body 10A, on which a plurality of terminals are aligned in the lengthwise direction with their archly bent spring portions 42 exposed above. The terminals 40 are aligned in a number corresponding to those of the circuit conductors 14 and with a corresponding space between them. Each spring portion 42 is free at the tip and the free tips are aligned in a direction orthogonal to the alignment direction of the terminals 40. Also the upper and lower end faces of the connector housing 32A are formed with engagement grooves 34 respectively extending in parallel to the abutment surface 31.

The end of the insulator plate 12A of the flat circuit body 10A has two guide holes 16 and 16 formed with a space in-between in such a manner that they sandwich the area where the circuit conductors 14 are formed. The guide holes 16 are formed In parallel with the circuit conductors 14. A slide lock 20 is a strip of an appropriate width which is bent into a shape of square bracket with a protruding arm 22 at each end having a hook 24 bent inward at the tip. Each hook 24 is adapted to slidably engage with the engagement groove 34 of the connector 30A. The slide lock 20 is attached integrally to the flat circuit body 10A in such a manner that it may slide along the guide holes 16 by means of the arms 22 each having its tip passed through the guide hole 16 and having its hook 24 engaged, preventing the arms 22 from slipping out the guide holes 16.

In order to connect the flat circuit body 10A to the connector 30A, the end of the flat circuit body 10A is first opposed to the abutment surface 31 of the connector 30A. The circuit conductors 14 are then press-contacted against the spring portions 42 of the corresponding terminals 40 of the connector 30A. As such, the slide lock 20 may be slid along the flat circuit body 10A as shown in FIGS. 2 and 3 to engage the hooks 24 of the arms 22 of the slide lock 20 into the engagement grooves 34 on the connector 30A. By so doing, since the slide lock 20 encompasses the flat circuit body 10A and presses the same against the connector 30A, the press-contacted state between the circuit conductors 14 of the flat circuit body 10A and the spring portions 42 of the terminals 40 of the connector 30A may be retained, by which the flat circuit body 10A can be electrically connected via the connector 30A with another or other circuit(s).

According to this structure, it will not be necessary to frictionally slide the circuit conductors 14 against the terminals 40 of the connector 30A as in conventional plug-in structures, therefore eliminating such damages as may occur by scraping off the terminals 40 of the connector 30A or the circuit conductors 14 of the flat circuit body 10A or by corrosions from frictional sliding movements. In addition, it will only be necessary to simply contact the circuit conductors 14 of the flat circuit body 10A against the terminals 40 of the connector 30A, therefore causing no accidental twining-into or insertion into a wrong place, which may happen for plug-in structures. Moreover, since the circuit conductors 14 of the flat circuit body 10A are contacted against the spring portions 42 of the terminals 40 of the connector 30A, a proper press-contacted state may always be retained. A reliable electrical connection may therefore be obtained by a simple operation of merely sliding the slide lock 20 along the guide holes 16.

In addition, because the slide lock 20 is attached through the guide holes 16 of the flat circuit body 10A, it will never be lost, facilitating management of such components. Also, depending on the shape of the contact of the spring portions 42 of the terminal 40 of the connector 30A, the contact may be selected and defined as desired, such as, of point contact, line contact or surface contact. Moreover, since the wall body of the protector is used as the insulator plate for the flat circuit body 10, the insulator per se is stable in shape and can therefore be used as it is for a rigid wiring element.

In the first embodiment, a slide lock 20 which is slidable along the surface of the flat circuit body 10A is used for a locking member; however, other types of locking member may also be used for the same effect.

Figure 5:
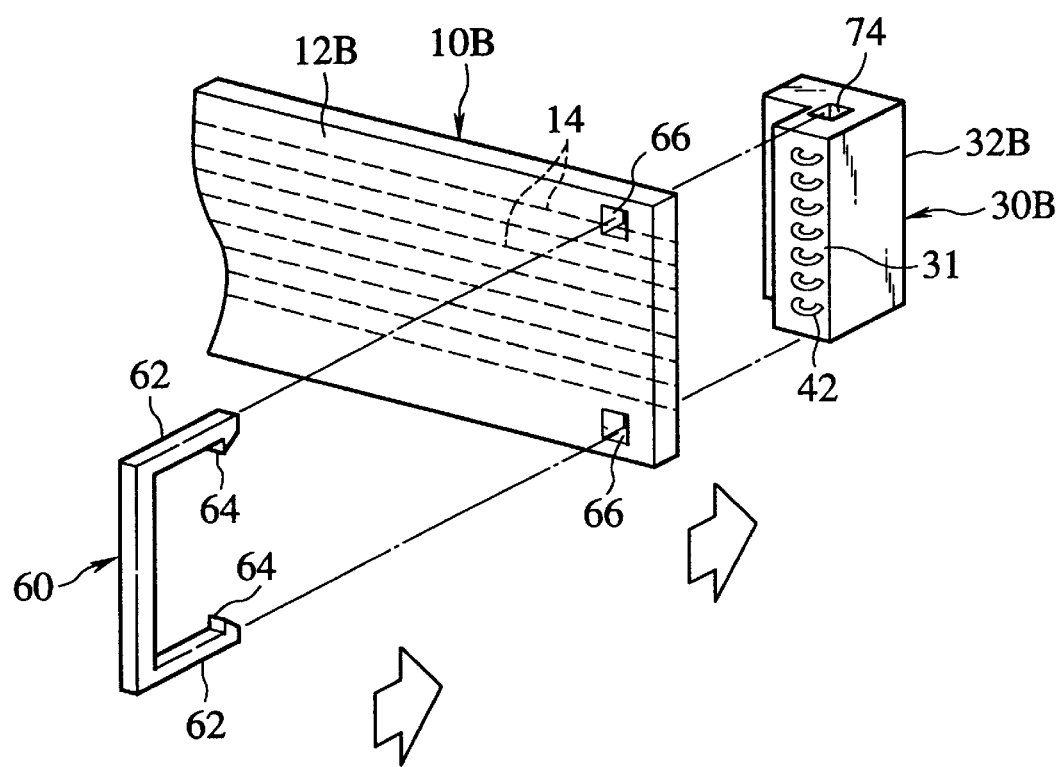
FIG. 5 is a perspective view illustrating a connecting structure according to a second embodiment of the present invention in an unassembled state.
Figure 6A:
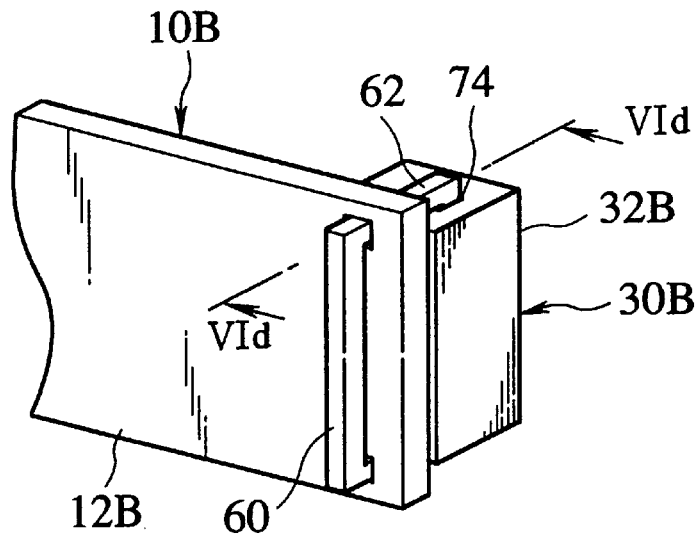
FIG. 6A is a perspective view illustrating the second embodiment of the present invention as connected.
Figure 6B:
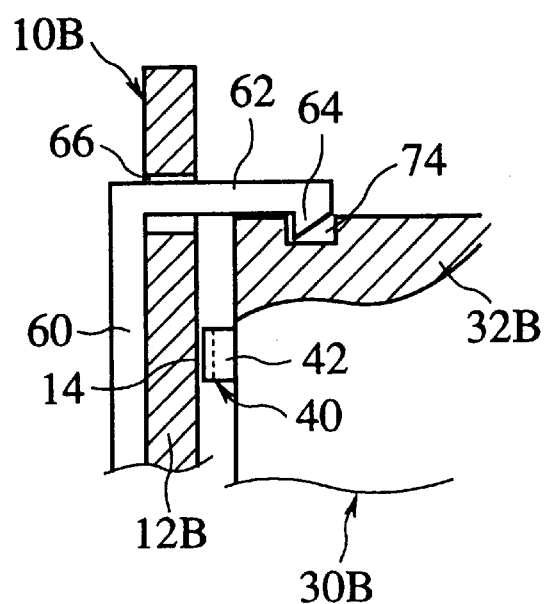
FIG. 6B is a sectional view taken along the line VIb—VIb of FIG. 6A.

FIGS. 5, 6A and 6B illustrate a second embodiment of the present invention. In this embodiment, an insulator plate 12B of a flat circuit body 10B is provided with simple throughholes 66 instead of guide holes. Also, a square bracket shaped slide lock 60 is provided having two arms, each of which has a tip insertable into each of the throughholes 66. In addition, provided at the tips of the arms 62 are hooks 64 which, by passing the arms through the throughholes 66 and sliding them in the direction of the passage, may be engaged into engagement recesses 74 formed on the upper and lower end faces of a housing 32B of a connector 30B. Apart from the above, all the structures are the same as the first embodiment.

In this structure, in order to connect the flat circuit body 10B with the connector 30B, the end of the flat circuit body 10B is opposed to an abutment surface 31 of the connector 30B. Circuit conductors 14 are then press-contacted against spring portions 42 of corresponding terminals 40 of the connector 30B. As such, the arms 62 of the slide lock 60 may be passed through the throughholes 66 and slid in the direction of the passage (a direction perpendicular to the flat circuit body 10B) to engage the hooks 64 at the tips of the arms 62 into the engagement recesses 74 of the connector 30B. By so doing, since the slide lock 60 encompasses the flat circuit body 10B and presses the same against the connector 30B, the press-contacted state between the circuit conductors 14 of the flat circuit body 10B and the spring portions 42 of the terminals 40 of the connector 30B may be retained, by which the flat circuit body 10B can be electrically connected via the connector 30B with another or other circuit(s).

According to this structure, the flat circuit body 10B can easily be connected with the connector 30B merely by sliding the slide lock 60 vertically in relation to the flat circuit body 10B. Again in this case, by passing the arms 62 of the slide lock 60 through the throughholes 66 in advance, the slide lock 60 may be kept attached to the flat circuit body 10B.

The above embodiment illustrates a wall body of a protector being used as an insulator plate for a flat circuit body; however, the protector may be formed separately from the flat circuit body, with guide holes or throughholes formed on the protector, through which the slide lock can be inserted to sandwich the flat circuit body between the protector and the connector, to provide an electrical connection between them.

As heretofore described, according to the present invention, since circuit conductors of a flat circuit body are simply press-contacted against spring portions of terminals of a connector by using a square bracket shaped locking member which encompasses the flat circuit body and engages with the housing of the connector, an electrical connection can be obtained with no frictional sliding movements, thereby not damaging the terminals of the connector or the circuit conductors of the flat circuit body. In addition, it is only necessary to simply contact the circuit conductors of the flat circuit body to the terminals of the connector, causing no accidental twining-into or insertion into a wrong place, which may happen for plug-in structures. Moreover, since the circuit conductors of the flat circuit body are contacted against the spring portions of the terminals of the connector, a proper press-contacted state may always be retained. A reliable connection may therefore be obtained by a simple operation of merely engaging the locking member. Also, depending on the shape of the contact of the spring portions, the contact may be selected and defined as desired, such as, of point contact, line contact or surface contact.

In addition, because the locking member is slid along the flat circuit body, hooks on the tips of the arms can be engaged into the engagement grooves merely by sliding the locking member, with the circuit conductors of the flat circuit body abutted to the spring portions of the terminals of the connector, so that the circuit conductors of the flat circuit body may easily and reliably be press-contacted against the spring portions of the terminals of the connector.

Also, in order to connect the flat circuit body with the connector, it will only be necessary to slide the locking member along guide holes through the flat circuit body, facilitating the connecting operation. Moreover, because the locking member is attached to the flat circuit body, it will never be lost, facilitating management of such components.

Also, according to the second embodiment of the present invention, a flat circuit body may easily be connected with a connector by passing arms of a locking member through throughholes formed through an insulator plate of the flat circuit body, and sliding and pushing the arms through.

Moreover, when a wall body of a protector is used as the insulator plate for the flat circuit body, the insulator per se is stable in shape and can therefore be used as it is for a rigid wiring element with a protector thereon.

It should be understood that many modifications and adaptations of the invention will become apparent to those skilled in the art and it is intended to encompass such obvious modifications and changes in the scope of the claims appended hereto.

What is claimed is:

1. An electrical connecting structure comprising:

a flat circuit body including an insulator plate having two elongated guide holes, a first and a second surface, and circuit conductors on the first surface;

an electrical connector including a housing having terminals formed by spring portions exposed above an abutment surface thereof and engagement grooves defined on the sides thereof; and a locking member shaped as a square bracket having two arms for encompassing said flat circuit body and said electrical connector, said two arms extending through said two elongated guide holes from said first surface to said second surface and being slidably disposed along each of said two elongated guide holes and having tips for slidably engaging with said engagement grooves of said electrical connector while said circuit conductors of said flat circuit body are press-contacted against said spring portions of said electrical connector.

2. An electrical connecting structure according to claim 1, wherein said engagement grooves are formed between upper and lower end faces of said housing grooves when the locking member is slid along said flat circuit body.

3. An electrical connecting structure according to claim 2, wherein each of said two arms is locked by each of said hooks to secure said flat circuit body between said locking member and said electrical connector.

4. An electrical connecting structure according to claim 1, wherein the insulator plate of said flat circuit body includes a wall body protector.

* * * * *